United States Patent
Ashkenazi et al.

(10) Patent No.: US 7,805,339 B2
(45) Date of Patent: Sep. 28, 2010

(54) SYSTEMS AND METHODS FOR FACILITATING INTERNET SHOPPING

(75) Inventors: Amir Ashkenazi, Rye Brook, NY (US); Oren Glickman, Israel (IL); Paul Howe, New York, NY (US)

(73) Assignee: Shopping.com, Ltd., Netanya (IL)

( * ) Notice: Subject to any disclaimer, the term of this patent is extended or adjusted under 35 U.S.C. 154(b) by 1579 days.

(21) Appl. No.: 10/324,621

(22) Filed: Dec. 18, 2002

(65) Prior Publication Data
US 2004/0019536 A1 Jan. 29, 2004

Related U.S. Application Data

(60) Provisional application No. 60/398,515, filed on Jul. 23, 2002.

(51) Int. Cl.
*G06F 17/30* (2006.01)
(52) U.S. Cl. .............. 705/27; 705/10; 705/14; 705/26; 705/28
(58) Field of Classification Search ........... 705/26, 705/27
See application file for complete search history.

(56) References Cited

U.S. PATENT DOCUMENTS

| | | | | |
|---|---|---|---|---|
| 5,870,717 | A * | 2/1999 | Wiecha | 705/26 |
| 6,049,797 | A * | 4/2000 | Guha et al. | 707/6 |
| 6,381,597 | B1 | 4/2002 | Lin | 707/4 |
| 6,430,541 | B1 | 8/2002 | Brown et al. | 705/28 |
| 6,606,744 | B1 * | 8/2003 | Mikurak | 717/174 |
| 7,013,290 | B2 * | 3/2006 | Ananian | 705/27 |
| 2001/0014868 | A1 * | 8/2001 | Herz et al. | 705/14 |
| 2001/0044758 | A1 * | 11/2001 | Talib et al. | 705/27 |
| 2002/0002502 | A1 * | 1/2002 | Maes et al. | 705/26 |
| 2002/0002513 | A1 * | 1/2002 | Chiasson | 705/27 |
| 2002/0007321 | A1 * | 1/2002 | Burton | 705/26 |
| 2002/0013735 | A1 * | 1/2002 | Arora et al. | 705/26 |
| 2002/0082932 | A1 * | 6/2002 | Chinnappan et al. | 705/26 |

OTHER PUBLICATIONS

An evaluation of interactive query expansion in an online library catalogue with a graphical user interface. Hancock-Beaulieu, M; Fieldhouse, M; Thien Do. Journal of Documentation. Sep. 1995. vol. 51, No. 3, pp. 225-243.*
Bin, Sergy and Page, Lawrence, "The Anatomy of a Large-Scale Hypertextual Web Search Engine", *Computer Science Department, Stanford University*, pp. 1-18.

* cited by examiner

*Primary Examiner*—F. Zeender
*Assistant Examiner*—Fawaad Haider

(57) ABSTRACT

Systems and methods for facilitating online comparison shopping, including a similarity engine, a navigational system, and a step skipping system. The systems and methods according to the invention include a method for determining similarity between two preferably disparate products. The systems and methods also preferably include a method of increasing efficiency of navigation in a comparison shopping site based on product coverage and product entropy. The systems and methods further include a method of step-skipping to quicken user navigation through a comparison shopping site.

36 Claims, 11 Drawing Sheets

DealTime.
COMPARE PRODUCTS, PRICES & STORES

| BABIES & KIDS | BOOKS | CARS | CLOTHING | COMPUTERS | ELECTRONICS | FLOWERS & GIFTS | HEALTH & BEAUTY |
| HOME & GARDEN | JEWELRY | MOVIES | MUSIC | OFFICE | SERVICES | SOFTWARE | SPORTS | TOYS & VIDEO GAMES | TRAVEL |

[HOME] SEARCH FOR: [____] IN [DIGITAL CAMERAS ▼] (GO)   [HELP]

ELECTRONICS >

DIGITAL CAMERAS: 1 MATCHING MODEL

REFINE YOUR RESULTS                                SORTED BY: POPULARITY ▼

CANNON ▼
$[__] TO $[__]
AT LEAST 4X ZOOM ▼
WHAT'S A ZOOM?
1.5-2.5 MEGAPIXELS ▼
WHAT IS RESOLUTION?
AT LEAST 3X DIGITAL ▼
AT LEAST 64MB MEMO ▼
ANY MAX. RESOLUTI ▼
ANY FLASH ▼

⚠ WE'RE SORRY, THERE ARE NO 64MB OR HIGHER MEMORY, CANON, 3X OR HIGHER DIGITAL ZOOM, 3X OR HIGHER ZOOM, AND 0-1.5 MEGAPIXELS DIGITAL CAMERAS

HERE ARE ALL 64MB OR HIGHER MEMORY, 3X OR HIGHER DIGITAL ZOOM, 3X OR HIGHER ZOOM, AND 1.5-2.5 MEGAPIXELS DIGITAL CAMERAS ↙ 390

SANYO IDC-1000ZU DIGITAL CAMERA

☒  1.5 MEGAPIXELS, 3X OPTICAL ZOOM, 1.8 IN. LCD PANEL, 730MB ID PHOTO    PRICE RANGE:
    MAGNETO OPTICAL DISK, OPTICAL VIEWFINDER,....SEE FULL SPECS              $1099
                                                                      ○ COMPARE PRICES
BE ONE OF THE FIRST TO REVIEW THIS PRODUCT                              AT 1 STORE

FEATURED     [B H]    $1099.95 AT
MERCHANT:             B&H PHOTO VIDEO, INC.

*FIG. 3A*

| ATTRIBUTE WEIGHT 0.8 ~430 | ATTRIBUTE 1 MATERIAL | | |
|---|---|---|---|
| ATTRIBUTE 1 MATERIAL | WHITE GOLD | YELLOW GOLD | PLATINUM |
| WHITE GOLD | 1 | 0.7 | 0.8 |
| YELLOW GOLD ~420 | 0.7 | 1 | 0.6 |
| PLATINUM | 0.8 | 0.6 | 1 |

DealTime.
COMPARE PRODUCTS, PRICES & STORES

| HOME & GARDEN | BABIES & KIDS | JEWELRY | BOOKS | CARS | CLOTHING | COMPUTERS | ELECTRONICS | FLOWERS & GIFTS | HEALTH & BEAUTY |
| MOVIES | MUSIC | OFFICE | SERVICES | SOFTWARE | SPORTS | TOYS & VIDEO GAMES | TRAVEL |

[HOME]  SEARCH FOR: [EARRINGS] —575  IN [JEWELRY] ▶ (GO)  [HELP]

REFINE YOUR SEARCH HERE ▶

JEWELRY > "EARRINGS"

PRICE RANGE: —575
▲ $0-50 (4041)
▲ $50-100 (3777)
▲ $100-500 (2229)
▲ $500-$1000 (472)
▲ ABOVE $1000 (252)

MATERIAL: —575
▲ YELLOW GOLD (6239)
▲ SILVER (1965)
▲ WHITE GOLD (375)
▲ TWO-TONE (30)
▲ PLATINUM (12)

GEMSTONE: —575
▲ NO GEMSTONE (4075)
▲ DIAMOND (2069)
▲ CUBIC ZIRCONIA (468)
▲ PEARL (332)
▲ GARNET (116)
▲ BLUE TOPAZ (114)
▲ RUBY (88)
▲ SAPPHIRE (79)
▲ EMERALD (59)
▲ TANZANITE (29)

GOLD TYPE:
▲ 10 KARAT (483)
▲ 14 KARAT (6414)
▲ 18 KARAT (202)

SEE CURRENT RESULTS BELOW ▶

576

THERE ARE 10771 MATCHES FROM 94 STORES

| STORE INFO | PRODUCT INFO | SORT BY: PRICE |
| ⓑ BLUE NILE | # | 18K GOLD BRUSHED DOUBLE-ROW DIAMOND EARRINGS - 2645 THESE 18K GOLD EARRINGS HAVE TWO ROWS OF BRILLIANT DIAMONDS AND A BRUSHED GOLD FINISH. TOGETHER, THESE... | $300.00 |
| STORE RATING: REVIEW THIS STORE | | ▶ BUY IT AT BLUE NILE |

PERSONAL ORGANIZERS: 17 MODELS MATCHING "PALM PILOT"

910 — NOT LOOKING FOR PERSONAL ORGANIZERS? CLICK HERE TO SEE OTHER MATCHES FOR "PALM PILOT"

SORTED BY: STORES ▶

REFINE YOUR RESULTS

ANY BRAND ▶

$ 50  TO $ 1800

ANY OPERATING SY... ▶

WHAT IS OPERATING SYSTEM?

ANY COLOR DEPTH ▶

WHAT IS COLOR DEPTH?

ANY INSTALLED ME... ▶

WHAT IS INSTALLED MEMORY?

KEYWORD
PALM PILOT

SUBMIT

SEE MORE REFINE OPTIONS

SEARCH BY BRAND
AUDIOVOX
CASIO
COMPAQ
FIC
FRANKLIN
FUJITSU

PALM M515 PERSONAL ORGANIZERS
PALM OS, 16 MB INSTALLED MEMORY, 16-BIT (64K COLORS), 160 X 160 RESOLUTION, OPTIONAL MODEM, BACKLIGHT DISPL...  SEE FULL SPECS
☆☆☆☆☆ (4.6/5.0)  READ 9 REVIEWS  |  WRITE REVIEW
$250-$389
AT 27 STORES

PALM I705 PERSONAL ORGANIZERS
PALM OS, 8 MB INSTALLED MEMORY, 160 X 160 RESOLUTION, BUILT IN WIRELESS MODEM, BACKLIGHT DISPLAY  SEE FULL SPECS
☆☆☆☆☆ (3.5/5.0)  READ 2 REVIEWS  |  WRITE REVIEW
$146-$400
AT 25 STORES

PALM M130 PERSONAL ORGANIZERS
PALM OS, 8 MB INSTALLED MEMORY, 12-BIT (4K COLORS), 160 X 160 RESOLUTION, OPTIONAL MODEM, BACKLIGHT DISPLAY  SEE FULL SPECS
☆☆☆☆☆ (5.0/5.0)  READ 6 REVIEWS  |  WRITE REVIEW
$170-$279
AT 24 STORES

PALM M125 PERSONAL ORGANIZERS
PALM OS, 8 MB INSTALLED MEMORY, 2-BIT (4 GRAY LEVELS), 160 X 160 RESOLUTION, OPTIONAL MODEM, BACKLIGHT DISP...  SEE FULL SPECS
☆☆☆☆☆ (3.8/5.0)  READ 6 REVIEWS  |  WRITE REVIEW
$108-$179
AT 21 STORES

*FIG. 9*

SYSTEMS AND METHODS FOR FACILITATING INTERNET SHOPPING

CROSS-REFERENCE TO RELATED APPLICATION

This application claims priority from U.S. Provisional Application No. 60/398,515 filed on Jul. 23, 2002.

BACKGROUND OF THE INVENTION

This invention relates to various systems and methods for facilitating shopping on a computer network. More particularly, this invention relates to systems and methods that increase the efficiency of Internet and Intranet shopping Online shopping—i.e., purchasing items at websites on the World Wide Web or other suitable networks—is well known. Nevertheless, the technology associated with Internet shopping is evolving.

It would be desirable to provide systems and methods of facilitating Internet shopping that decrease time spent by purchasers when shopping for a particular item.

It would also be desirable to provide systems and methods of facilitating Internet shopping that increase traffic to a particular website or group of websites.

It would further be desirable to provide systems and methods of facilitating Internet shopping that decrease the time, and decision making resources, spent by a purchaser at a comparison shopping website—i.e., a website that compares merchant websites and may be used to direct the purchaser to merchant websites, the websites that allow the purchaser to shop for and purchase goods and/or services.

SUMMARY OF THE INVENTION

It is an object of the invention to provide systems and methods of facilitating Internet shopping that decrease time spent by purchasers when shopping for a particular item.

It is also an object of the invention to provide systems and methods of facilitating Internet shopping that increase traffic to a particular website or group of websites.

It is a further object of the invention to provide systems and methods of facilitating Internet shopping that decrease the time, and decision making resources, spent by a purchaser at a comparison shopping website—i.e., a website that compares merchant websites and may be used to direct the purchaser to merchant websites, the websites that allow the purchaser to shop for and purchase goods and/or services.

In accordance with this invention, there is provided a similarity engine for use in conjunction with an Internet shopping site. The similarity engine is for determining similarity between a first product and a second product. The similarity engine is configured to receive a plurality of attributes that are related to the first product, receive a plurality of attributes that are related to the second product, and to determine a set of attributes that includes attributes that are related to at least one of the first product and the second product. The similarity engine is also configured to compare the attribute values of the first product to the attribute values of the second product to obtain attribute value similarity information for each attribute in the set of attributes.

In another aspect of the invention, An Internet shopping system adapted for providing navigational assistance to a user shopping for a product, the product including a plurality of attributes, each of the attributes including attribute values, the system for ordering the attributes based on relevance, is preferably provided. The system may be configured to receive a user product query and return a plurality of products in response to the query. The system may be further configured to calculate an entropy for each attribute included in the plurality of products and prioritize at least a portion of the attributes that are included in the priority of products based on the attribute entropy. The system may also be configured to display the prioritized portion of the attributes.

In yet another aspect of the invention, a shopping system adapted for providing navigational assistance to a user is provided. The system may be configured to receive a shopping query including at least one keyword, determine whether the at least one keyword meets a relevance threshold with respect to a single shopping category, and, when the relevance threshold is met, determine whether at least one intermediate navigational step can be skipped in order to display a shopping page associated with the single shopping category.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3A is a screen shot of a screen according to the invention which implements a similarity to provide a "closest matches" functionality;

FIG. 4 is a table representing a similarity table according to the invention;

FIG. 5A shows a screen shot of a screen according to one embodiment of the invention which shows a portion of the most relevant navigation options for a user;

FIGS. 6-8 are screen shots of conventional screens associated with a comparison shopping site; and FIG. 9 is a screen shot of a step-skipped screen according to the invention.

DETAILED DESCRIPTION OF THE INVENTION

Figure 1:
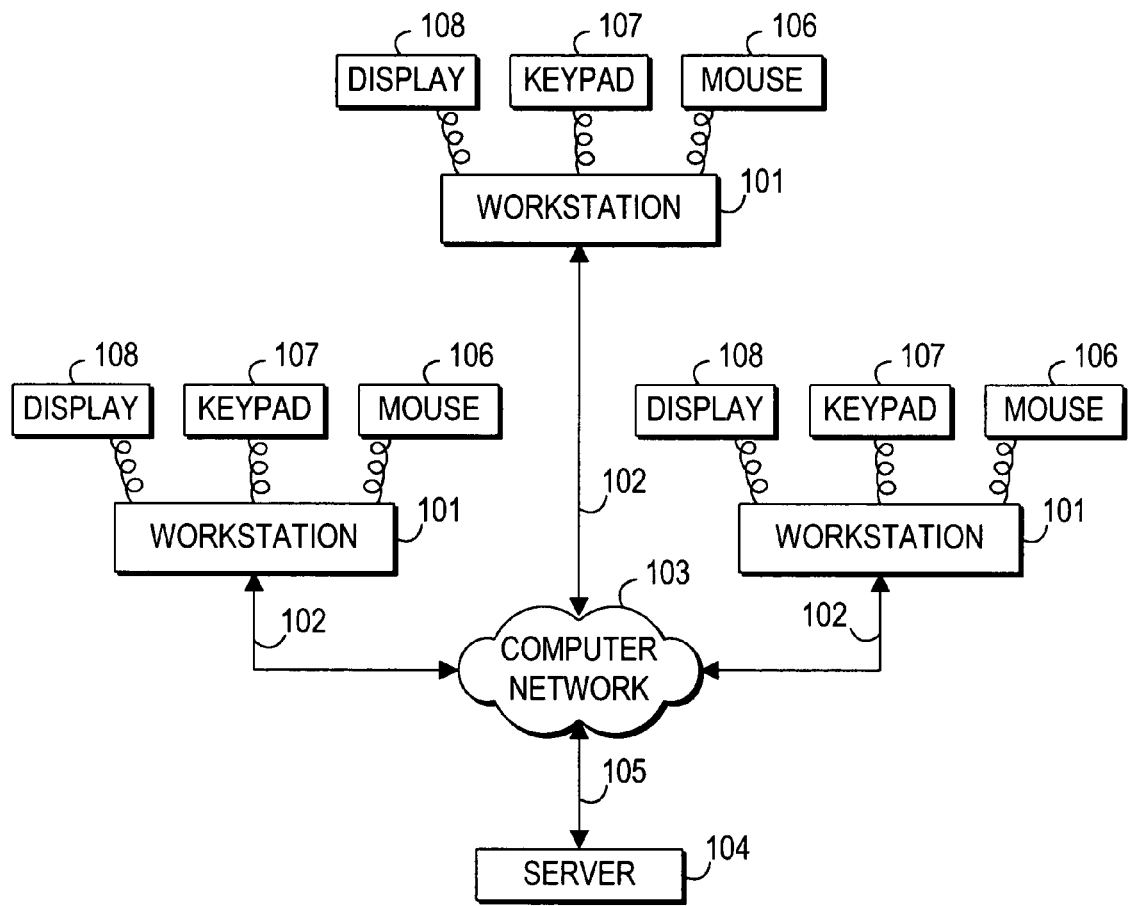
FIG. 1 is an illustration of an electronic implementation of a software system according to the present invention.

Referring to FIG. 1, exemplary electronic shopping system 100 for implementing the present invention is shown. As illustrated, system 100 may include one or more workstations 101. Workstations 101 may be local or remote, and are connected by one or more communications links 102 to computer network 103 that is linked via communications links 105 to server 104.

In system 100, server 104 may be any suitable server, processor, computer, or data processing device, or combination of the same. Server 104 and back office clearing center 112 may form part of the electronic shopping system. Furthermore, server 104 may also contain the shopping system and merely transmit a Graphical User Interface or other display screens to the user at the user workstation.

Computer network 103 may be any suitable computer network including the Internet, an intranet, a wide-area network (WAN), a local-area network (LAN), a wireless network, a digital subscriber line (DSL) network, a frame relay network, an asynchronous transfer mode (ATM) network, a virtual private network (VPN), or any combination of any of the same. Communications links 102 and 105 may be any communications links suitable for communicating data between workstations 101 and server 104, such as network links, dial-up links, wireless links, hard-wired links, etc.

Workstations 101 may be personal computers, laptop computers, mainframe computers, dumb terminals, data displays, Internet browsers, Personal Digital Assistants (PDAs), two-way pagers, wireless terminals, portable telephones, etc., or any combination of the same. Workstations 102 may be used to implement the electronic shopping system according to the invention.

Figure 2:
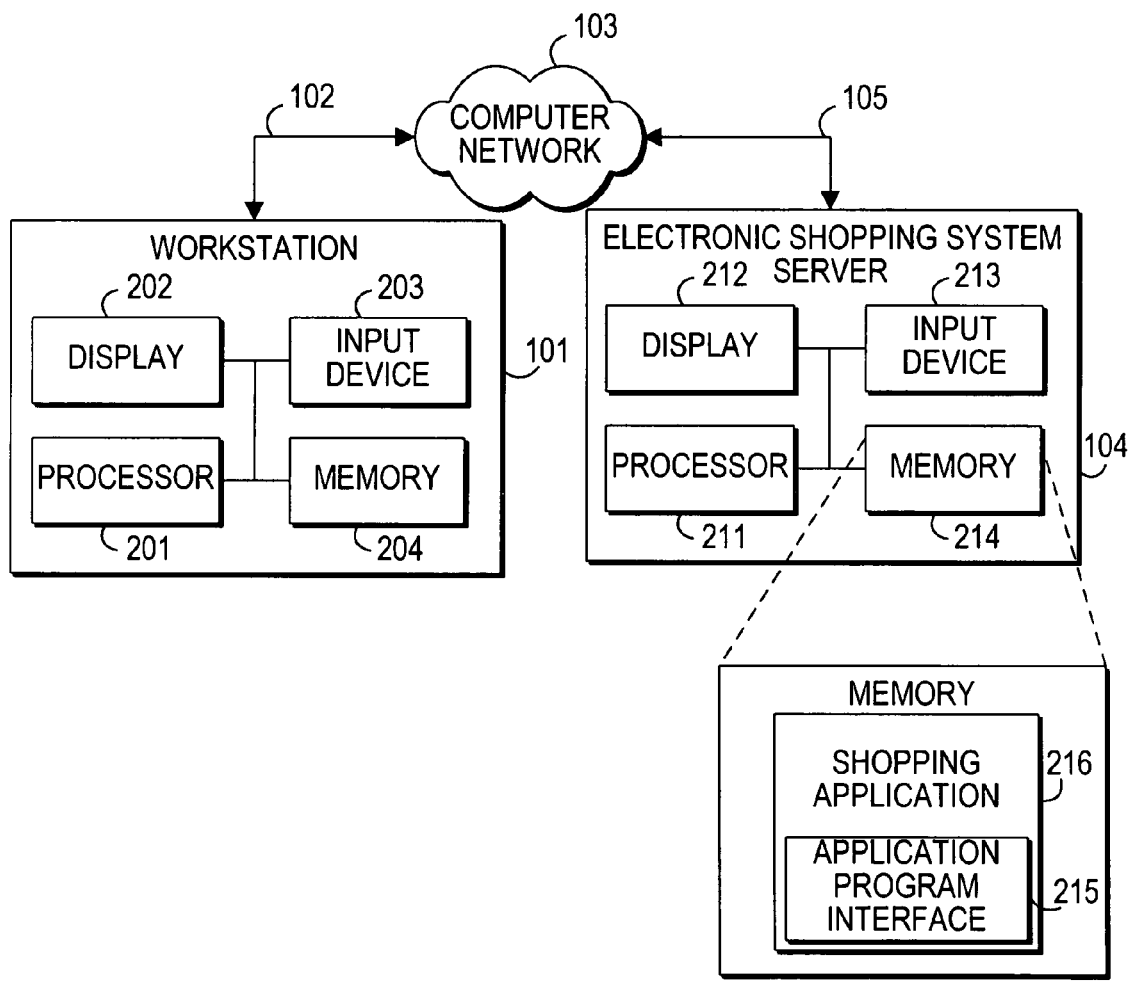
FIG. 2 is a block diagram of a workstation and a server that may be used to implement the processes and functions of certain embodiments of the present invention.

The server and one of the workstations, which are depicted in FIG. 1, are illustrated in more detail in FIG. 2. Referring to FIG. 2, workstation 101 may include processor 201, display 202, input device 203, and memory 204, which may be interconnected. In a preferred embodiment, memory 204 contains a storage device for storing a workstation program for controlling processor 201. Memory 204 also preferably contains a shopping application 216 according to the invention.

Shopping application 216 may preferably include application program interface 215, or alternatively, as described above, shopping application 216 may be resident in the memory of server 104. The only distribution to the user may be a Graphical User Interface which allows the user to interact with shopping application 216 resident at server 104.

Processor 201 uses the workstation program to present on display 202 shopping information relating to merchant websites or other shopping conditions received through communication link 102 and commands, queries and navigational instructions or other suitable information transmitted by a user of workstation 101. Furthermore, input device 203 may be used to manually enter commands, queries and navigational instructions in order for these commands, queries and navigational instructions to guide the user to a merchant website, or to pass the information to a merchant website.

For the purposes of this application, the following table defines some terms that will used herein:

| TERM | DEFINITION |
| --- | --- |
| Product | A good or service (which may include goods or services offered by a merchant website, such goods or services which are referred to herein as deals) wherein the good or service possesses certain attributes |
| Attribute | A particular characteristic of a product (e.g., for a product on a ring, characteristics such as material of the ring, or whether the ring includes a gemstone, may be considered attributes) |
| Attribute Value | A particular type within an attribute (e.g., for an attribute of material of a ring, attribute values may include platinum, white gold, silver etc.) These attribute values may be extracted manually - - - i.e., via a human operator - - - or using a machine-learning algorithm that is trained on annotated examples to extract the attribute value or values. These algorithms are known to one skilled in the art. Two types of such suitable algorithms include classifiers and value-extractors. |
| Attribute Weight | A weighting factor that assigns a relative weight to a particular attribute with respect to other attributes |
| Entropy | A value that describes how well the attribute values divide the attribute |

One aspect of the invention which relates to online comparison shopping disclosed herein is a similarity engine. A similarity engine according to the invention receives a profile of a product and compares it to the profile of another product. The profile is preferably formed from a collection of some or all the product attributes. The similarity engine may also be used to return a list of similar products ranked by similarity to one another or to a pre-selected product. Finding similarity may also provide a user with satisfactory products in response to user queries such as, "What can I get for more/less money?" A similarity engine may also help a user find a product by attribute profile instead of by brand name or model number.

Figure 3:
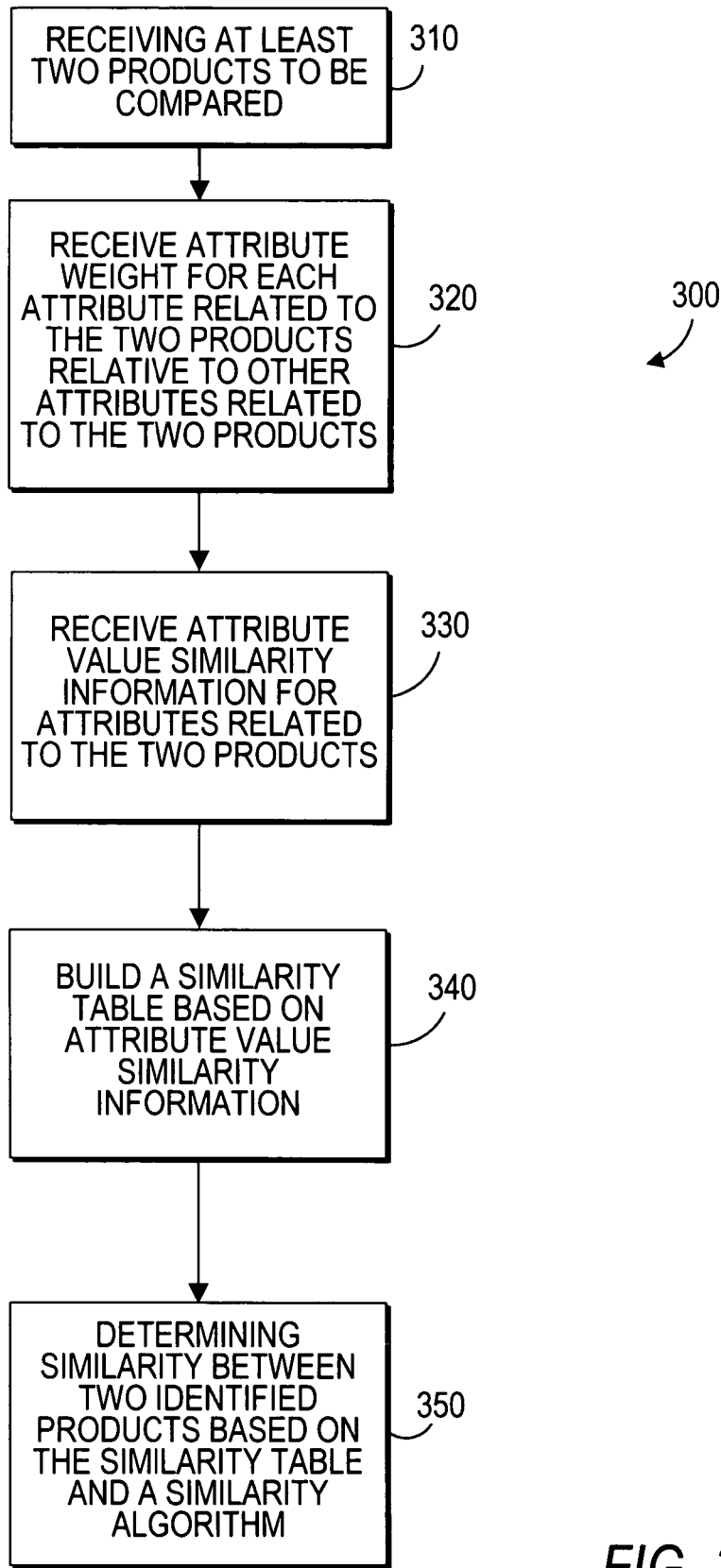
FIG. 3 is a flow diagram representing a preferred embodiment of the method according to the invention for providing a similarity engine for comparing different products.

FIG. 3 shows a flow diagram 300 representing a preferred embodiment of the method according to the invention for providing a similarity engine for comparing different products. It should be noted that any method in this application is not temporally limited in any fashion unless stated or indicated otherwise.

The following steps are shown in FIG. 3 and illustrate a method according to the invention of providing a similarity engine to determine similarity of products. Step 310 shows receiving two products two be compared. Step 320 shows receiving attribute weight for each attribute related to the two products relative to other attributes related to the two products. The attribute weight may be derived in any number of suitable ways. These ways may include utilizing an assessment of an industry expert in the industry related to the product to determine the relative weights of particular attributes, using past user behavior to determine the relative weights of particular attributes, or allowing the user to configure the attribute weight.

Assigning attribute weight for each attribute accounts for the fact that some attributes are more important than others. The following portion of XML code, relating to an exemplary diamond ring, defines a weight of 4.0 to the category—e.g., ring or necklace—0.6 to style, 1.0 to the price range, 0.5 to the material, 0.1 to diamond shape, weight and clarity, 0.1 to occasion, and 0.7 to gold type:

```
<numbered-attributes>
<attribute name="Category" weight="4." />
<attribute name="Style" weight=".6" />
<attribute name="Price Range" weight="1" />
<attribute name="Material" weight=".5" />
<attribute name="Diamond Shape" weight=".1" />
<attribute name="Diamond Size" weight=".1" />
<attribute name="Diamond Clarity" weight=".1" />
```

-continued

```
<attribute name="Occasion" weight=".1" />
<attribute name="Gold Type" weight=".7" />
</numbered- attributes>
```

Step 330 receiving attribute value similarity information for attributes related to the two products—i.e., a quantity value assigned to the similarity between two or more attribute values such as the similarity between a ring made of white gold and a ring made of yellow gold. This value of similarity between attributes may be determined in any number of suitable ways as described above with respect to determining the relative attribute weight.

For sequence type attributes, such as price, the attribute value similarity may be defined by the drop in similarity with each step or other suitable sequential function. For example, for every change in price range, a step similarity drop may be assigned. The following XML illustrates such a system:

```
Product in the "$50-$100" with product in the "$50-$100" -
   Similarity Contribution is 1
Product in the "$50-$100" with product in the "$100-$500" -
   Similarity Contribution is 0.8
Product in the "$50-$100" with product in the "$500-$1000" -
   Similarity Contribution is 0.6
<attribute type="range" add-column="yes" step-similarity-
   drop="0.2" weight="1." >
<name>Price Range</name>
<field>PRICE</field>
<below value="50">$0-$50</below>
<below value="100">$50-$100</below>
<below value="500">$100-$500</below>
<below value="1000">$500-$1000</below>
<above value="1000">Above $1000</above>
</attribute>
```

For each attribute, the similarity information may be translated to a similarity table which is divided into attributes and attribute values within the attributes. Step 340 shows the step of building a similarity table based on attribute value similarity information. The similarity table is an array that defines the similarity between any pair of attribute values (like a distance table for a map). Preferably, the similarity between any pair of attribute values is defined within a particular attribute is defined. FIG. 4 shows an exemplary similarity table according to the invention that corresponds to the above-captioned XML. FIG. 4 will be described in more detail below.

Once attribute weights and attribute values have been determined (and, in a preferred embodiment, a similarity table has been built), a comparison may be formed between two products. Step 340 shows a step of receiving at least two product identifiers to be compared. These product identifiers may represent two specific products offered by one or more merchant websites. Alternatively, one product may be substantially simultaneously compared with numerous other products.

Step 350 shows determining similarity between two identified products based, in a preferred embodiment, on the similarity table and a similarity algorithm. The following similarity algorithm may be implemented to calculate the similarity between two objects, P1 and P2:

TotalSimilarity (TotSim)=0
  For each attribute (A)
    For each attribute value of P1 in A (P1AV)
      For each attribute value of P2 in A (P2AV)
        TotSim=TotSim+AttributeWeight*Similarity (P1AV,P2AV)

Example:
P1 has the following profile
Material: Yellow Gold & White Gold
Price Range: $100-$500
P2 has the following profile
Material: Platinum, White Gold
Price Range: $50-$100
Then (using the similarity definitions in the previous examples) the calculation may be:
In the attribute "Material"
Sim(Yellow Gold, Platinum)=0
Sim(White Gold, Platinum)=0.7
Sim(Yellow Gold, White Gold)=0
Sim(White Gold, White Gold)=1
In the attribute "Price Range"
Sim ($100-$500, $50-$100)=0.8

TotSim(P1, P2)=0.5*(0+0.7+0+1)+1*(0.8)=1.65

Other suitable metrics may be applied to the total similarity calculation to either normalize the result—i.e., set the result such that the similarity calculation always obtains a number between zero and one—or to perform some other known calculation. Other known calculation may include sorting multiple results according to a pre-determined order, or penalizing multiple entries in a single attribute such as yellow gold and white gold in the material attribute. Nevertheless, calculation using these, or any other, suitable metrics does not depart from a method according to the invention.

Furthermore, a similarity engine according to the invention may preferably manipulate or transfer product data as sequential collections of attribute value identifications. It should be noted that the similarity searches may retrieve results limited to a particular category—e.g., ring or necklace—by assigning a relatively large weight to the category attribute and may be configured to output a particular number of results. Finally, the results of any similarity comparison performed by the similarity engine according to the invention may be an ordered list of products or products which are ranked by their similarity to the profile.

Another advantage of a similarity engine is to avoid zero search results when a user requests a feature comparison to a pre-selected product. The ability to specify a combination of attribute values may lead a user to retrieve zero results from a user-defined search. In many cases, it is not clear which condition needs to be removed to obtain valid search results. Users may struggle with the search interface three, four or even more times before they obtain useful results. To avoid this frustration, the shopping application may be configured to use the similarity engine to provide the user the closest matches to his defined criteria.

FIG. 3A shows an example of the formatting and functionality of such an operation. The portion 390 of the screen shot 300 shows how such a "closest matches" functionality may be implemented. Furthermore, similarity engine functionality may allow a shopping application to provide the user with the ability to request, "More products like this".

In one embodiment of the invention, the similarity engine may be used for such applications in an Internet matchmaking site to identify compatible or similar matches or, alternatively in an Internet employment site to identify employees that show similarity to employers and employers that show similarity to employees. In yet another embodiment, the similarity engine may be used to compare employees to employees, employers to employers, or employees and/or employers to a desired profile.

FIG. 4 shows an embodiment of a similarity table 400 according to the invention. Table 400 is divided into attribute boxes such as attribute box 410. Each attribute box 410, which represents a single attribute, is typically divided into attribute values 420. Attribute values 420 are arranged such that a similarity between each attribute and each other attribute is readily available in an array form. An attribute weight 430 may preferably be associated with each attribute box 410. It is shown from FIG. 4 that any number of attribute boxes may be used, and the array may be extended either vertically, horizontally, or both, for products that relate to numerous attributes.

Another aspect of the invention relates to determining, and prioritizing, the most relevant attributes for navigation through the comparison shopping site by the user. For example, when the user defines a query, a result set of products may be obtained. The attributes associated with the products in the result set may include a number of relevant attributes. The number of relevant attributes, which may be 30 or greater in a given query, may be too large to allow for useful presentation of all the attributes to the user for navigation. Therefore, it would be desirable to present the user with only those attributes that are the most relevant to his or her navigation and to eliminate attributes from the display if the attributes do not meet a minimum relevancy threshold.

In a preferred embodiment of a method according to the invention, three factors may be relied upon to determine attribute priority—i.e., the relative importance of the attribute with respect to the other attributes associated with the user query. These three factors may include attribute entropy—i.e., how well the retrieved attribute values divide the attribute—attribute product coverage—i.e., percentage of retrieved products that include the attribute—and the attribute weight (as defined above). Nevertheless, any suitable metric that measures how well the attribute values divide the attribute may be used for determining priority.

In an exemplary algorithm according to the invention, the three factors may be combined as follows (though any suitable algorithm that combines the three factors (or even one or two of the three factors) may be used): First, each of these numbers may be normalized—i.e., set to a value between zero and one. Then the total relevancy, or alternatively, the attribute priority, may be determined by assigning an importance, W1, W2 and W3, to each of the factors. The algorithm may be arranged thusly:

$$AttributePriority = \frac{W1*AttributeDealCoverage + W2*AttributeEntropy + W3*AttributeWeight}{3}$$

In order to calculate the entropy and the product coverage, the following statistical information may be required from the results set retrieved by the initial user-query based search: the number of products retrieved which include each attribute, and the number of products which include each attribute value. These numbers may be calculated by the search engine after finding all the matching products.

As described above, attribute entropy describes how well the attribute values divide the attribute. With respect to more efficient navigation, it is preferably to choose attributes that include attribute values that slice the set of products in equal parts. Attribute values that divide the attribute in substantially equal, or at least fairly substantial, parts should represent a real dilemma that the shopper is facing. Such an attribute, that includes attribute values that divide the attribute in substantial portions, should preferably be one provided to the user as a navigation choice.

Consider the following search results for the query "gold" with respect to a ring. The following calculations show that the "Gold Type" attribute is divided to attribute values in a way that yields a better entropy than dividing using the attribute "material." Therefore, the attribute value "Gold Type" may obtain a greater "navigation benefit" to the user than the attribute value "Material".

The entropy is calculated in the following way:

The entropy of a set S with c elements is: Entropy(S)=

$$\sum_{i=1}^{c} -p_i \log_2(p_i)$$

Where $p_i$ is the proportion of class i elements in S.

$$p_i = \frac{AttributeValue(i) \cdot NumberOfDeals}{Attribute(x) \cdot TotalNumberOfDeals}$$

This result is normalized by dividing the entropy by log2(c) so that the results are always in [0,1] independent of the number of elements in S.

[ ]So the complete function for the calculation of the Entropy of Attribute x is:

$$Attribute(x) \cdot Entropy = \frac{\sum_{i=1}^{c} -\frac{AttributeValue(i) \cdot NumberOfDeals}{Attribute(x) \cdot TotalNumberOfDeals} \log_2\left(\frac{AttributeValue(i) \cdot NumberOfDeals}{Attribute(x) \cdot TotalNumberOfDeals}\right)}{\log 2(c)}$$

For Example:

If the search results statistics are:

Total Number of Matching Products—100

| "Gold Type" | |
|---|---|
| 10 K | 25 |
| 14 K | 22 |
| 18 K | 20 |
| 24 K | 18 |
| Total | 85 |
| "Material" | |
| Gold | 70 |
| Silver | 10 |
| Diamond | 10 |
| Ruby | 5 |
| Total | 95 |

The entropy of the "Gold Type" attribute is:

$$E(\text{Gold Type})=(-25/85*\log2(25/85)-22/85*\log2(22/85)-20/85*\log2(20/85)-18/85*\log2(18/85))/\log2(4)=0.995$$

And the entropy of the "Material" attribute is:

$$E(\text{Material})=(-0.70*\log2(0.70)-0.10*\log20.10-0.10*\log2(0.10)-0.05*\log2(0.05))/\log2(4)=0.616$$

Thus, it is shown that entropy of gold type is superior to the entropy of material.

Another factor in determining the attribute priority is attribute product coverage. Relevant attributes apply to many products and calculating the product coverage may be implemented in an equation as follows:

$$DealCoverage = \frac{Attribute(x) \cdot TotalNumberOfDeals}{TotalNumberOfMatchingDeals}$$

Using the product statistics quoted above:

$$ProductCoverage(\text{Gold Type})=85/100=0.85$$

$$ProductCoverage(\text{Material})=95/100=0.95$$

The attribute priority may be any suitable metric—e.g., an average—of the attribute entropy, the attribute product coverage, and the attribute weight. The following example shows an attribute priority calculation using the entropy and product coverage derived from the statistics shown above and averaging those statistics with an arbitrary weight:

$$\text{Weight (Gold Type)}=1 \text{ and Weight (Material)}=0.8$$

$$AttributePriority(\text{Gold Type})=(0.995+0.85+1)/3=0.948$$

$$AttributePriority(\text{Material})=(0.616+0.95+0.8)/3=0.788$$

It is thereby shown that, in this particular example, the attribute priority of Gold Type is greater than the attribute priority of Material. Thus, it would be advantageous to present a user with the navigational choices associated with Gold Type before presenting the user with the navigational choices associated with Material.

Figure 5:
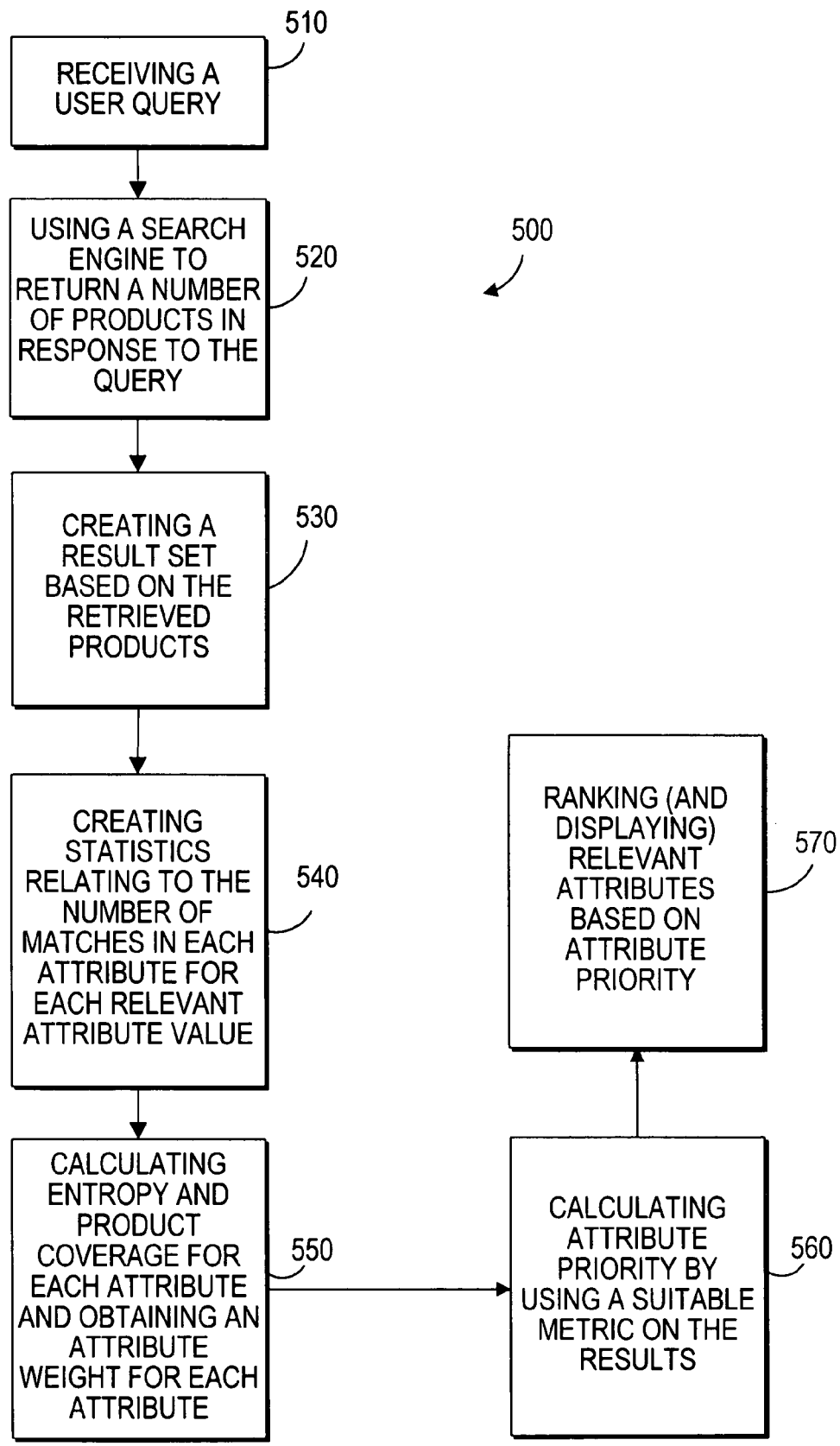
FIG. 5 is a flow diagram representing a preferred embodiment of a method according to the invention for identifying relevant navigation options to a user.

FIG. 5 shows a flow diagram 500 that illustrates a method for determining the most relevant attributes for navigation by the user. Step 510 shows receiving a user query. Step 520 shows using a search engine to return a number of products in response to the query. Step 530 shows creating a result set based on the retrieved products. Step 540 shows creating statistics, preferably by using a statistics module, about the number of matches in each attribute for each attribute value. Step 550 shows calculating entropy of each attribute, calculating product coverage of each attribute, and obtaining an arbitrary—e.g., as determined by an expert or in another suitable fashion—attribute weight for each attribute. Step 560 shows calculating attribute priority by using a suitable metric on the results to obtain an attribute priority. Step 570 shows ranking (and, if desired, displaying) relevant attributes (or a portion of the relevant attributes) based on attribute priority.

FIG. 5A shows a preferred embodiment of a screen shot of a group of most relevant attributes 575 listed for a user. Each of attributes 575 preferably include attribute values 576. Thus, the user's navigation is made for efficient.

In a related area, a comparison shopping experience, as is well known in the art, may require the user to navigate through multiple steps before he arrives at his desired destination. A method of presenting the user with the most efficient navigational steps has already been described above. Nevertheless, in yet another aspect of the invention, a step-skipping process may be implemented to add efficiency to on-line shopping. This step-skipping process may preferably be used together with the method of increasing navigation efficiency described above, or, alternatively, may be used by itself. In a multi-step process, methods and systems according to the invention preferably identify redundant steps and eliminate these steps, thereby substantially shortening the user shopping experience.

Figure 6:
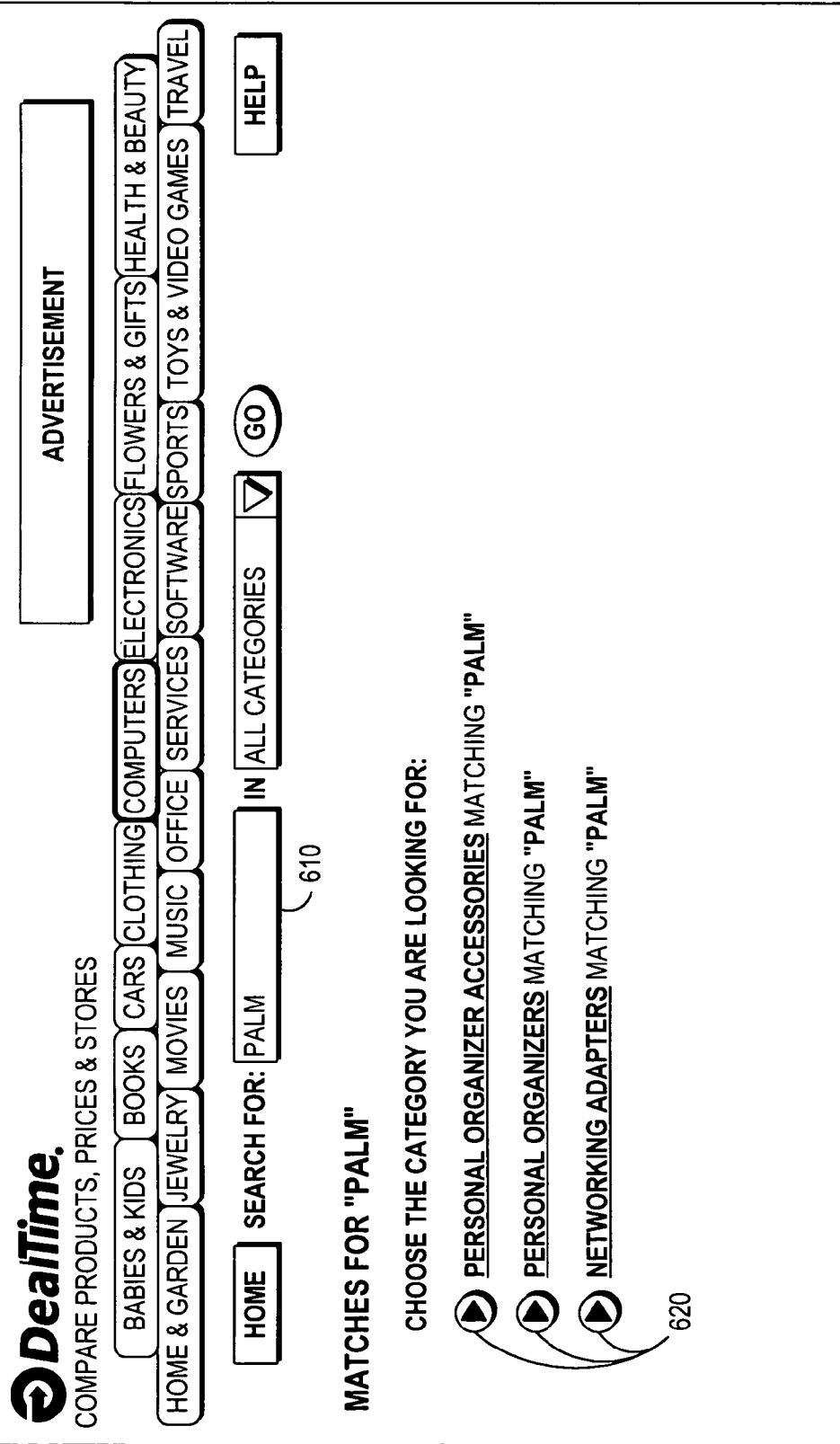
Figure 7:
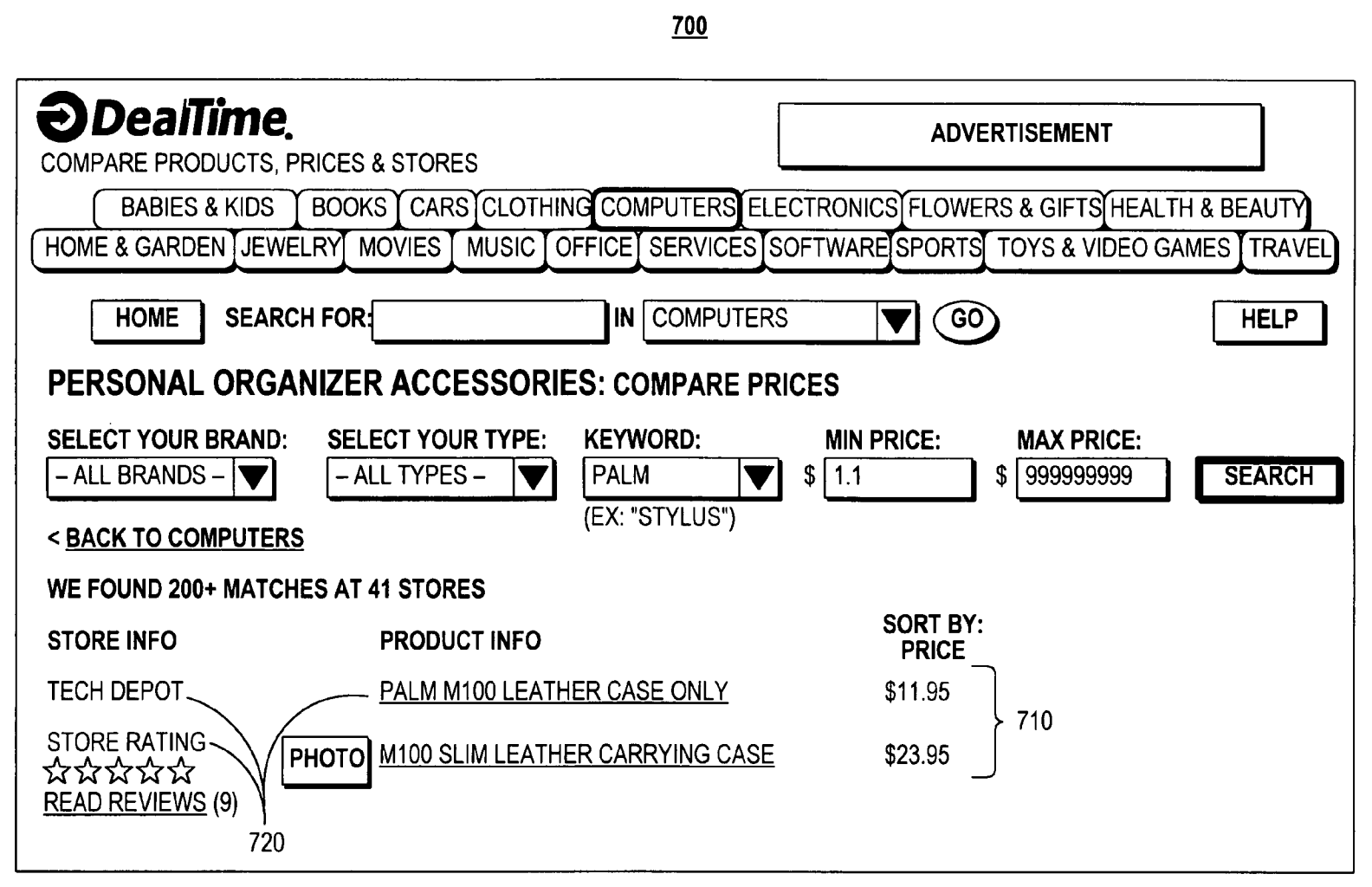
Figure 8:
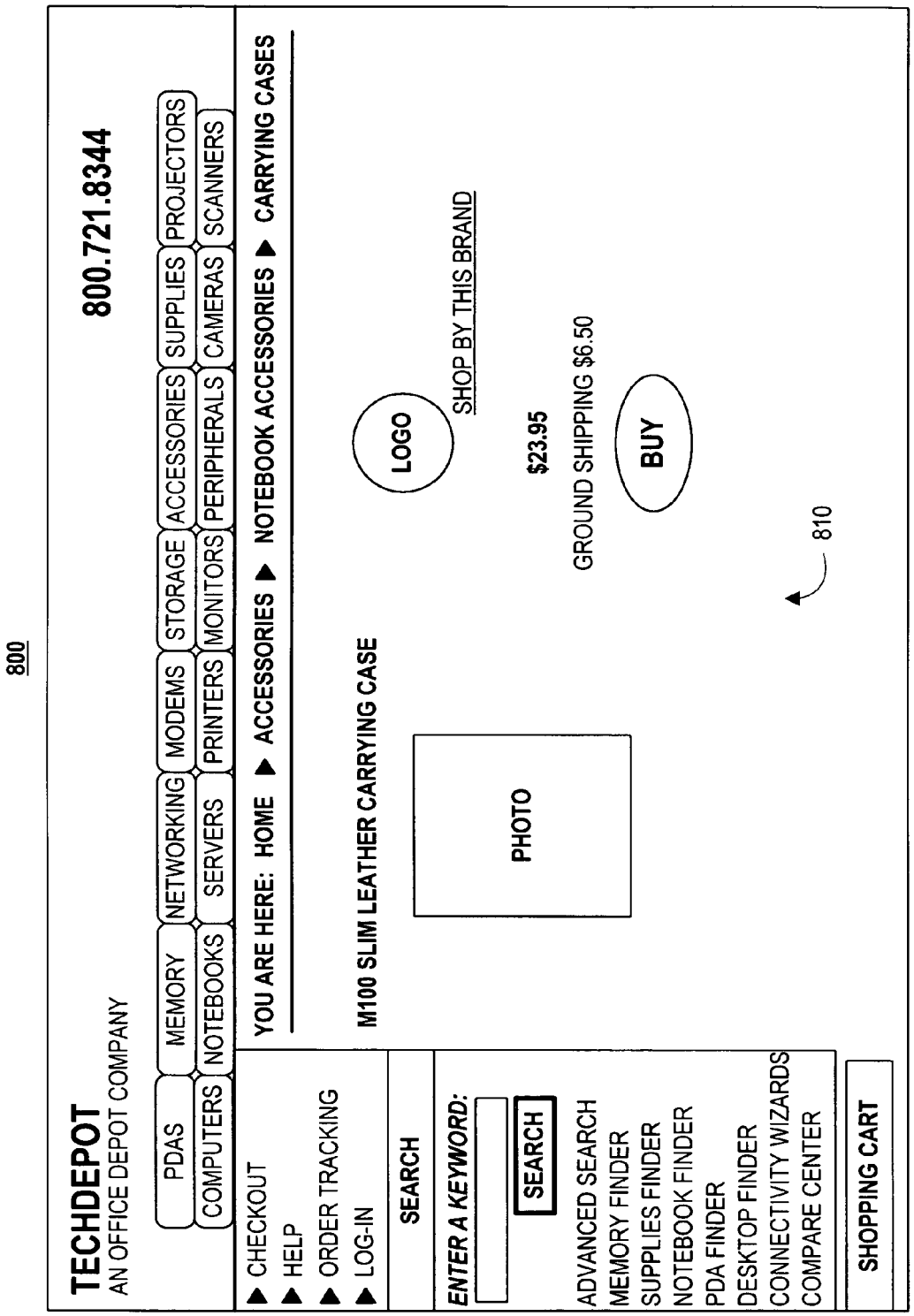

In order to better understand the following description of step-skipping, FIGS. 6-8 show a conventional process that is known to those skilled in the art of comparison shopping sites. FIG. 6 shows global search results that were retrieved based on a search for the keyword "palm." When a user enters the word palm in the keyword area 610, there are multiple forms 620—e.g., personal organizer accessories, personal organizers, and networking adapters—that are retrieved and placed in the search results.

FIG. 7 shows the results of a user selection of a form 620. When a user clicks on one of the forms, interactive screen 700 displays the "product search" results 710 of products associated with the selected form. Interactive screen 700 preferably includes product links 720 to merchant sites.

By clicking on one of the product links 720 in FIG. 7, the user is brought to the merchant site 800 shown in FIG. 8. At the merchant site, the user is free to purchase the selected product 810.

The foregoing description corresponding to FIGS. 6-8, and relating to conventional comparison shopping sites, has been provided to better understand the following description of another aspect of the invention.

Typically, when users perform searches by keyword in modern search engines, most searches return a number of groupings of results (see FIG. 6 above) among which the user can pick out the most relevant choice for his specific query. In a comparison shopping environment—e.g., at a comparison shopping web site—this selection using a "navigational click" is often the first step in navigating out of the comparison shopping site to a merchant site using a "merchant click." The merchant click is a click that delivers the user from the comparison shopping site to the merchant site.

The number of required navigational clicks is inversely proportional to the likelihood of a merchant click. Thus, reducing the number of navigational clicks increases the likelihood of the user performing a merchant click, or multiple merchant clicks. Methods according to the invention propose that a "Skip by Popularity" functionality, as will be explained below, effectively eliminates the first navigational click, or multiple navigational clicks, by the user, directing the user's browser to the most relevant result immediately, rather than providing the user with multiple choices.

As part of the general search functionality in the context of a comparison shopping site, a skip by popularity functionality evaluates each keyword submitted to a search engine. The skip by popularity functionality then determines whether the keyword or keywords submitted are highly relevant to a specific category. When a relevance threshold with respect to a specific category is met, certain criteria may be applied to test whether the user can be skipped over intermediate navigational steps and immediately delivered to the highly relevant category or even to a comparison shopping page for a specific product. Skip by popularity functionality may be used to determine and select the single most popular product associated with the keyword as determined either by users, or according to some other suitable determination scheme.

The following is an example of a skip by popularity method according to the invention. The term "Palm PC" has relevant deals on a comparison shopping site in over 15 categories; however, 92% of subsequent clicks occur within the Personal Organizer category. Skip by popularity functionality recognizes this as the most popular category and submits the user's search term for results only within Personal Organizers.

When applied, this functionality effectively moves the user past intermediate navigation that occurs when the submitted term has relevant matches in multiple categories on the comparison shopping web site—i.e., the search engine shortens user navigation by skipping steps. Skip by popularity finds the most popular category for the entered term and searches for that term within the identified category.

In one embodiment of the invention, skip by popularity functionality reviews all keywords entered into the search and earmarks certain keywords with which to determine its' most relevant category. Exemplary requirements for a word to qualify for use as a "skip by popularity" term may be as follows:

Frequency. Term has been submitted to search engine at least 10 times within past 30 days Click Concentration. More than 50% of the merchant clicks that resulted from searches on the Term must be concentrated to one "form." (A form is the lowest level to which products are categorized. For example, Electronics is considered a category, TV/Video a subcategory, and DVD players a form where all DVD product search results would be returned and sorted.)

Term cannot include www or .com

When these initial requirements have been satisfied, skipping by popularity or other suitable results filters, may be applied based on certain criteria. The following terms have been defined for the purposes of greater explanation and for use in the table set forth below. The table shows an exemplary set of criteria for skipping.

Productization Level of Forms: Productized Forms and Non-Productized Forms

Productized Forms: Forms where products have been further categorized into model specific groups. Users can search by product name and attributes. Products are presented preferably only by specific product model. For example, the Televisions form is productized so it is possible to see products only for the Sony KV-40XBR700 model television, organized as one group of products.

Non-productized Forms: In these forms, products are not categorized to the model level. Users can only search by keyword and product attributes. For example, the Men's Clothing form is not productized so it is only possible to see products for Men's Shirts made by Ralph Lauren (by selecting type=shirt and brand=Ralph Lauren)—It is not possible to see competing store offers for an identical shirt.

Merchant Click: A click that delivers the user from the comparison shopping site—e.g., ProductTime.com TM—to a merchant site—e.g., www.amazon.com.

Global Search Conversion Threshold: The percentage of Global Searches—i.e., basic keyword searches not limited to a particular category—for a given term that result in a products search executed by a user.

2nd Category Click Threshold: For any given term with Global Search matches in more than one form, each of the forms represent a percentage of merchant clicks for that term. In order to skip a step, the first form should make up at least 50% of the merchant clicks for that term. The 2nd category click threshold represents the percentage of merchant clicks in the next most popular form compared to the most popular form.

| One Preferable Set of Specifications for Skipping a Step | | |
|---|---|---|
| Merchant Clicks | Global Search Conversion Threshold (GSCT) | 2nd Category ("cat") Click Threshold |
| Productized Terms | | |
| Terms with 4-9 product clicks | GSCT>=15% | 2nd cat click must be 34% or less than 1st cat click |
| Terms with 10 or more product clicks | GSCT>=10% | 2nd cat click must be 20%, or less than 1st cat click |
| Terms with 15 or more product clicks | GSCT<10% & GSCT>=2% | 2nd cat click must be 34% or less than 1st cat click |
| Terms with between 5 and 15 product clicks | GSCT<10% & GSCT>=2% | 2nd cat click must be 34% or less than 1st cat click |
| Merchant Clicks | Global Search Conversion Threshold (GSCT) | 2nd Catergory Click Threshold |
| Non-Productized Terms | | |
| Terms with 4-9 product clicks | GSCT>=15% | 2nd cat click must be 34% or less than cat click |
| Terms with 10 or more product clicks | GSCT>=10% | 2nd cat click must be 20%, or less than cat click |
| Terms with 15 or more product clicks | GSCT<10% & GSCT>=2% | 2nd cat click must be 34% or less than cat click |

To better understand the function of the above tables, one row will be examined in depth. In the first table, the second row includes terms with 10 or more merchant clicks—i.e., searches based on this term have resulted in at least 10 or merchant clicks over a pre-determined time period, such as a month. The term in this row is further required to have a percentage of keyword searches that result in a products search—i.e., a search performed in an identified category or sub-category—executed by a user that is greater than or equal to ten percent of the total global searches performed with this term. Finally, in order to skip a step, the first form, which represents the most popular category for the term, should obtain at least 20% more of the merchant clicks for that term than the second most popular form for the term. If all these requirements are satisfied, then the user may be skipped through additional navigational steps and immediately directed to the form that has fulfilled the requirements. Alternatively, if, based on certain preferably pre-determined criteria, a single product is highly relevant to the keyword, a shopping screen for the particularly product may be immediately displayed to the user.

Thus, when the word is entered to global search, instead of further navigation, the user is preferably lead to search results within the relevant form or, when applicable, is directed to a shopping page for a single product.

It should be noted that the table illustrates one embodiment of how the various factors for skipping described above can be applied. The values for the factors can be adjusted for skipping logic that is conservative or more pliant.

FIG. 9 is a screen shot of a step-skipped screen according to the invention. In this screen, message 910 shows a possible message that allows users who are not interested in the screen to which the user was skipped to return to other related screens.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A shopping system adapted for providing navigational assistance to a user, the shopping system including:
   a computer system configured to:
   present a graphical user interface to a computer of the user to receive a shopping query including at least one keyword;
   determine a search result for the shopping query at a server of the shopping system, wherein:
      the search result includes a plurality of different shopping categories for the at least one keyword when the at least one keyword matches products in multiple shopping categories,
      a shopping page associated with each single shopping category of the plurality of different shopping categories can be displayed in response to subsequent selection of each single shopping category from among the plurality of different shopping categories included in the search result,
      each shopping page associated each single shopping category comprises a comparison shopping page for comparing different products that match the at least one keyword, and
      each shopping page associated with a particular single shopping category includes at least one product link for navigating to a shopping page related to a product in the particular single shopping category that matches the at least one keyword;
   when the search result for the shopping query includes a plurality of different shopping categories for the at least one keyword, determine whether a relevance threshold is met with respect to a most popular single shopping category of the plurality of different shopping categories for the at least one keyword, wherein:
      the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and
      the relevance threshold is determined based on a comparison of number of navigational clicks for the most popular single shopping category and number of navigational clicks for a next most popular single shopping category of the plurality of different shopping categories for the at least one keyword;
   when the relevance threshold is met, determine whether the at least one intermediate navigational step can be skipped in order to immediately display a shopping page associated with the most popular single shopping category and related to a particular product in response to the shopping query rather than providing the user with the plurality of different shopping categories included in the search result or a comparison shopping page for comparing the particular product to one or more other products; and
   when the at least one intermediate navigational step is skipped, present the shopping page associated with the most popular single shopping category with a message including a link to a page related to the at least one intermediate navigational step that was skipped for allowing the user to return to the plurality of different shopping categories included in the search result.

2. The shopping system of claim 1, further configured to determine whether a shopping page related to a deal for the particular product can be immediately displayed in response to the shopping query when the relevance threshold is met.

3. The shopping system of claim 1, further configured to receive a shopping query including a plurality of keywords.

4. The shopping system of claim 1, further configured to determine whether the at least one keyword meets a threshold click concentration.

5. The shopping system of claim 1, further configured to determine whether more than a threshold percentage of navigational clicks are concentrated in a single predetermined product category resident in a categorization hierarchy of products.

6. The shopping system of claim 1, further configured to determine whether the at least one keyword comprises a term that terminates the eligibility of the keyword for step-skipping.

7. A shopping system adapted for providing navigational assistance to a user, the shopping system including:
   a computer system configured to:
   present a graphical user interface to a computer of the user to receive a shopping query including at least one keyword;
   determine a search result for the shopping query at a server of the shopping system, wherein:
      the search result includes a plurality of different shopping categories for the at least one keyword when the at least one keyword matches products in multiple shopping categories,
      a shopping page associated with each single shopping category of the plurality of different shopping categories can be displayed in response to subsequent selection of each single shopping category from among the plurality of different shopping categories included in the search result,
      each shopping page associated each single shopping category comprises a comparison shopping page for comparing different products that match the at least one keyword, and
      each shopping page associated with a particular single shopping category includes at least one product link for navigating to a shopping page related to a product in the particular single shopping category that matches the at least one keyword;

when the search result for the shopping query includes a plurality of different shopping categories for the at least one keyword, determine whether a relevance threshold is met with respect to a most popular single shopping category of the plurality of different shopping categories for the at least one keyword, wherein:

the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and the relevance threshold is determined based on a comparison of number of navigational clicks for the most popular single shopping category and number of navigational clicks for a next most popular single shopping category of the plurality of different shopping categories for the at least one keyword;

when the relevance threshold is met, skip the at least one intermediate navigational step in order to immediately display a shopping page associated with the most popular single shopping category and related to a particular product in response to the shopping query rather than providing the user with the plurality of different shopping categories included in the search result or a comparison shopping page for comparing the particular product to one or more other products; and when the at least one intermediate navigational step is skipped, present the shopping page associated with the most popular single shopping category with a message including a link to a page related to the at least one intermediate navigational step that was skipped for allowing the user to return to the plurality of different shopping categories included in the search result.

8. The shopping system of claim 7, further configured to determine whether a shopping page related to a deal for the particular product can be immediately displayed in response to the shopping query when the relevance threshold is met.

9. The shopping system of claim 7, further configured to receive a shopping query including a plurality of keywords.

10. The shopping system of claim 7, further configured to determine whether the at least one keyword meets a threshold click concentration.

11. The shopping system of claim 7, further configured to determine whether more than a threshold percentage of navigational clicks are concentrated in a single predetermined product category resident in a categorization hierarchy of products.

12. The shopping system of claim 7, further configured to determine whether the at least one keyword comprises a term that terminates the eligibility of the keyword for step-skipping.

13. A computer-implemented method of providing navigational assistance to a user, the method comprising:

presenting a graphical user interface to a computer of the user to receive a shopping query including at least one keyword;

determining a search result for the shopping query at a server, wherein:

the search result includes a plurality of different shopping categories for the at least one keyword when the at least one keyword matches products in multiple shopping categories, a shopping page associated with each single shopping category of the plurality of different shopping categories can be displayed in response to subsequent selection of each single shopping category from among the plurality of different shopping categories included in the search result, each shopping page associated each single shopping category comprises a comparison shopping page for comparing different products that match the at least one keyword, and each shopping page associated with a particular single shopping category includes at least one product link for navigating to a shopping page related to a product in the particular single shopping category that matches the at least one keyword;

when the search result for the shopping query includes a plurality of different shopping categories for the at least one keyword, determining whether a relevance threshold is met with respect to a most popular single shopping category of the plurality of different shopping categories for the at least one keyword, wherein:

the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and the relevance threshold is determined based on a comparison of number of navigational clicks for the most popular single shopping category and number of navigational clicks for a next most popular single shopping category of the plurality of different shopping categories for the at least one keyword;

when the relevance threshold is met, skipping the at least one intermediate navigational step in order to immediately display a shopping page associated with the most popular single shopping category and related to a particular product in response to the shopping query rather than providing the user with the plurality of different shopping categories included in the search result or a comparison shopping page for comparing the particular product to one or more other products; and when the at least one intermediate navigational step is skipped, presenting the shopping page associated with the most popular single shopping category with a message including a link to a page related to the at least one intermediate navigational step that was skipped for allowing the user to return to the plurality of different shopping categories included in the search result.

14. The method of claim 13, further comprising determining whether a shopping page related to a deal for the particular product can be immediately displayed in response to the shopping query when the relevance threshold is met.

15. The method of claim 13, further comprising receiving a shopping query including a plurality of keywords.

16. The method of claim 13, further comprising determining whether the at least one keyword meets a threshold click concentration.

17. The method of claim 13, further comprising determining whether more than a threshold percentage of navigational clicks are concentrated in a single predetermined product category resident in a categorization hierarchy of products.

18. The method of claim 13, further comprising determining whether the at least one keyword comprises a term that terminates the eligibility of the keyword for step-skipping.

19. A computer-implemented method for providing navigational assistance to a user, the method comprising:
   presenting a graphical user interface to a computer of the user to receive a shopping query including at least one keyword;
   determining a search result for the shopping query at a server, wherein:
      the search result includes a plurality of different shopping categories for the at least one keyword when the at least one keyword matches products in multiple shopping categories,
      a shopping page associated with each single shopping category of the plurality of different shopping categories can be displayed in response to subsequent selection of each single shopping category from among the plurality of different shopping categories included in the search result,
      each shopping page associated each single shopping category comprises a comparison shopping page for comparing different products that match the at least one keyword, and
      each shopping page associated with a particular single shopping category includes at least one product link for navigating to a shopping page related to a product in the particular single shopping category that matches the at least one keyword;
   when the search result for the shopping query includes a plurality of different shopping categories for the at least one keyword, determining whether a threshold value is met for at least one predetermined criteria related to a most popular single shopping category of the plurality of different shopping categories for the at least one keyword, wherein:
      the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and
      the threshold value is determined based on a comparison of number of navigational clicks for the most popular single shopping category and number of navigational clicks for a next most popular single shopping category of the plurality of different shopping categories for the at least one keyword;
   when the threshold value for the at least one predetermined criteria is met, determining whether the at least one navigational step can be skipped in order to immediately display a shopping page associated with the most popular single shopping category and related to a particular product in response to the shopping query rather than providing the user with the plurality of different shopping categories included in the search result or a comparison shopping page for comparing the particular product to one or more other products; and
   when the at least one intermediate navigational step is skipped, presenting the shopping page associated with the most popular single shopping category with a message including a link to a page related to the at least one intermediate navigational step that was skipped for allowing the user to return to the plurality of different shopping categories included in the search result.

20. The method of claim 19, further comprising determining whether a shopping page related to a deal for the particular product can be immediately displayed in response to the shopping query when the relevance threshold is met.

21. The method of claim 19, further comprising receiving a shopping query including a plurality of keywords.

22. The method of claim 19, further comprising determining whether the at least one keyword meets a threshold click concentration.

23. The method of claim 19, further comprising determining whether more than a threshold percentage of navigational clicks are concentrated in a single predetermined product category resident in a categorization hierarchy of products.

24. The method of claim 19, further comprising determining whether the at least one keyword comprises a term that terminates the eligibility of the keyword for step-skipping.

25. A computer-readable storage medium storing computer-executable instructions that, when executed by a computer processor, cause the computer processor to:
   present a graphical user interface to a computer of the user to receive a shopping query including at least one keyword;
   determine a search result for the shopping query at a server of the shopping system, wherein:
      the search result includes a plurality of different shopping categories for the at least one keyword when the at least one keyword matches products in multiple shopping categories,
      a shopping page associated with each single shopping category of the plurality of different shopping categories can be displayed in response to subsequent selection of each single shopping category from among the plurality of different shopping categories included in the search result,
      each shopping page associated each single shopping category comprises a comparison shopping page for comparing different products that match the at least one keyword, and
      each shopping page associated with a particular single shopping category includes at least one product link for navigating to a shopping page related to a product in the particular single shopping category that matches the at least one keyword;
   when the search result for the shopping query includes a plurality of different shopping categories for the at least one keyword, determine whether a relevance threshold is met with respect to a most popular single shopping category of the plurality of different shopping categories for the at least one keyword, wherein:
      the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and the relevance threshold is determined based on a comparison of number of navigational clicks for the most popular single shopping category and number of navigational clicks for a next most popular single shopping category of the plurality of different shopping categories for the at least one keyword;

when the relevance threshold is met, determine whether the at least one intermediate navigational step can be skipped in order to immediately display a shopping page associated with the most popular single shopping category and related to a particular product in response to the shopping query rather than providing the user with the plurality of different shopping categories included in the search result or a comparison shopping page for comparing the particular product to one or more other products; and when the at least one intermediate navigational step is skipped, present the shopping page associated with the most popular single shopping category with a message including a link to a page related to the at least one intermediate navigational step that was skipped for allowing the user to return to the plurality of different shopping categories included in the search result.

26. The computer-readable storage medium of claim 25, further comprising computer-executable instructions for determining whether a shopping page related to a deal for the particular product can be immediately displayed in response to the shopping query when the relevance threshold is met.

27. The computer-readable storage medium of claim 25, further comprising computer-executable instructions for receiving a shopping query including a plurality of keywords.

28. The computer-readable storage medium of claim 25, further comprising computer-executable instructions for determining whether the at least one keyword meets a threshold click concentration.

29. The computer-readable storage medium of claim 25, further comprising computer-executable instructions for determining whether more than a threshold percentage of navigational clicks are concentrated in a single predetermined product category resident in a categorization hierarchy of products.

30. The computer-readable storage medium of claim 25, further comprising computer-executable instructions for determining whether the at least one keyword comprises a term that terminates the eligibility of the keyword for step-skipping.

31. A computer-readable storage medium storing computer-executable instructions that, when executed by a computer processor, cause the computer processor to:

present a graphical user interface to a computer of the user to receive a shopping query including at least one keyword;

determine a search result for the shopping query at a server of the shopping system, wherein:

the search result includes a plurality of different shopping categories for the at least one keyword when the at least one keyword matches products in multiple shopping categories, a shopping page associated with each single shopping category of the plurality of different shopping categories can be displayed in response to subsequent selection of each single shopping category from among the plurality of different shopping categories included in the search result, each shopping page associated each single shopping category comprises a comparison shopping page for comparing different products that match the at least one keyword, and each shopping page associated with a particular single shopping category includes at least one product link for navigating to a shopping page related to a product in the particular single shopping category that matches the at least one keyword;

when the search result for the shopping query includes a plurality of different shopping categories for the at least one keyword, determine whether a relevance threshold is met with respect to a most popular single shopping category of the plurality of different shopping categories for the at least one keyword, wherein:

the most popular single shopping category is determined based on number of navigational clicks by other users that delivered the other users to each shopping page associated with each single shopping category of the plurality of different shopping categories, at least some of the other users having navigated through at least one intermediate navigational step before being delivered to the shopping page associated with the most popular single shopping category, the at least one intermediate navigational step including selecting from among the plurality of different shopping categories for the at least one keyword included in the search result, and the relevance threshold is determined based on a comparison of number of navigational clicks for the most popular single shopping category and number of navigational clicks for a next most popular single shopping category of the plurality of different shopping categories for the at least one keyword;

when the relevance threshold is met, skip the at least one intermediate navigational step in order to immediately display a shopping page associated with the most popular single shopping category and related to a particular product in response to the shopping query rather than providing the user with the plurality of different shopping categories included in the search result or a comparison shopping page for comparing the particular product to one or more other products; and when the at least one intermediate navigational step is skipped, present the shopping page associated with the most popular single shopping category with a message including a link to a page related to the at least one intermediate navigational step that was skipped for allowing the user to return to the plurality of different shopping categories included in the search result.

32. The computer-readable storage medium of claim 31, further comprising computer-executable instructions for determining whether a shopping page related to a deal for the particular product can be immediately displayed in response to the shopping query when the relevance threshold is met.

33. The computer-readable storage medium of claim 31, further comprising computer-executable instructions for receiving a shopping query including a plurality of keywords.

34. The computer-readable storage medium of claim 31, further comprising computer-executable instructions for determining whether the at least one keyword meets a threshold click concentration.

35. The computer-readable storage medium of claim 31, further comprising computer-executable instructions for determining whether more than a threshold percentage of navigational clicks are concentrated in a single predetermined product category resident in a categorization hierarchy of products.

36. The computer-readable storage medium of claim 31, further comprising computer-executable instructions for determining whether the at least one keyword comprises a term that terminates the eligibility of the keyword for step-skipping.

* * * * *